United States Patent [19]

Savir

[11] Patent Number: 5,394,405
[45] Date of Patent: Feb. 28, 1995

[54] UNIVERSAL WEIGHT GENERATOR

[75] Inventor: Jacob Savir, Mahopac, N.Y.

[73] Assignee: International Business Machines Corporation, Armonk, N.Y.

[21] Appl. No.: 873,131

[22] Filed: Apr. 24, 1992

[51] Int. Cl.$^6$ .............................................. G01R 31/28
[52] U.S. Cl. ...................................... 371/27; 364/717
[58] Field of Search ...................... 371/27, 15.1, 22.3, 371/25.1; 364/717

[56]     References Cited

U.S. PATENT DOCUMENTS

| 3,719,885 | 3/1973 | Carpenter et al. |          |
|-----------|--------|------------------|----------|
| 4,688,223 | 8/1987 | Motika et al.    | 371/27   |
| 4,801,870 | 1/1989 | Eichelberger et al. |      |
| 4,862,460 | 8/1989 | Yamaguchi        | 371/27   |
| 4,959,832 | 9/1990 | Bardell, Jr.     | 371/27   |
| 5,043,988 | 8/1991 | Brglez et al.    | 371/27   |
| 5,239,262 | 8/1993 | Grutzner et al.  | 371/27   |

OTHER PUBLICATIONS

A Method for Generating Weighted Random Test Patterns by J. A. Waicukauski et al., IBM Journal of Research and Development, vol. 33, No. 2, Mar. 1989, p. 149.
Cellular Automata Circuits for Built-In Self-Test by P. D. Hortensius et al, IBM Journal of Research and Development, vol. 34 No. 2/3, Mar./May 1990 p. 389.
Multiple Distributions for Biased Random Test Patterns by H. Wunderlich, IEEE Transactions on Computer-Aided Design, vol. 9, No. 6, Jun. 1990, p. 584.
The Weighted Random Test-Pattern Generator by H. D. Schnurmann et al., IEEE Transactions on Computers, vol. C-24, No. 7, Jul. 1975, p. 695.
Hardware-Based Weighted Random Pattern Generation for Boundary Scan by F. Brglez et al., IEEE, Paper 13.3, 1989, p. 264.
Interfacing to Boundary Scan Chips for System Level Bit by J. Turino, IEEE, 1989, p. 310.
Random Pattern Testing of LSSD Logic Devices by Multiple Sets of Weights by E. B. Eichelberger et al., IBM Technical Disclosure Bulletin, vol. 31, No. 8, Jan. 1989, p. 467.
Fixed-Bias an Variable-Bias Random Pattern Generator by A. L. Herman, IBM Technical Disclosure Bulletin, vol. 27, No. 1B, p. 468.
Weight Random Pattern Geenration for Self-Test by M. C. Noecker, IBM Technical Disclosure Bulletin, vol. 32, No. 10A, Mar. 1990, p. 140.

Primary Examiner—Robert W. Beausoliel, Jr.
Assistant Examiner—Albert Decady
Attorney, Agent, or Firm—Lawrence D. Cutter

[57]     ABSTRACT

A cascaded arrangement of alternating AND gates and Exclusive-OR gates is employed in conjunction with an output from a pseudo-random signal generator to produce a weighted random pattern binary sequence which is granularly controllable in terms of user selected probabilities and for which the granularity level is readily controlled through the selection of a desirable number of cascaded stages.

1 Claim, 1 Drawing Sheet

UNIVERSAL WEIGHT GENERATOR

The present invention is generally directed to random pattern testing for digital integrated circuit chip devices and systems. More particularly, the present invention is directed to a mechanism for producing weighted random bit patterns.

In the paper by J. A. Wacukauski et al, "A Method for Generating Weighted Random Test Patterns" appearing in the March 1989 issue of the IBM Journal of Research and Development (Vol. 33, No. 2) the desirability of employing weighted random test patterns is demonstrated. In particular, FIG. 4 from this paper illustrates a hardware implementation of a weight generator. However, as pointed out on page 156 of the article, the weighting scheme shown is limited in that the design produces weight factors of only 1,3,7 and 15. It is seen that the desired weighted pseudo-random value is produced from a sequence of tapped output signal lines originating from a linear feedback shift register (LFSR). The LFSR signals at the latch outputs are well understood to have pseudo-random characteristics. More particularly, it is known to connect the latch outputs in the LFSR in a feedback arrangement so as to implement maximally long state sequences before repetitions are encountered. In the embodiment shown, output signals from latches L are supplied to a cascaded sequence of AND gates. This cascaded sequence can produce sequences with weight factors $\frac{1}{2}$, $\frac{1}{4}$, $\frac{1}{8}$ and 1/16. However, in the present invention this limitation to certain discrete weighting factor is eliminated.

In effect the cascaded AND gates sequence provides a mechanism for controlling the probabilities for the occurrence of zeroes and ones in the test sequence. By supplying a plurality of these signals to a multiplexer (one out of four circuits in the above paper) one can produce an output sequence whose weighting factor can be chosen from a small set of discrete values. However the degree of resolution in achievable probability selection is limited. Nonetheless, the level sensitive scan design (LSSD) methodology is particularly useful when it is capable of being supplied with granular weighted test quantities. Thus, it is desirable to be able to more precisely control the probabilities associated with the zeroes and ones in an output test sequence. However, conventional weight generators are not capable of providing a universal set of weighting factors. Thus, while the circuit shown in FIG. 4 of the above cited paper by Wacukauski et al is capable of producing an output sequence with a weighting factor of $\frac{1}{8}$, the circuit is not capable of effectuating a weighting factor of 0.625, for example.

It is thus seen that it is desirable to employ weight generators for producing weighted test patterns for circuit testing wherein the generation of a highly granular set of weighting factors is made available.

SUMMARY OF THE INVENTION

In accordance with a preferred embodiment of the present invention a pseudo-random sequence generator provides a plurality of pseudo-random binary signal sequences to a staged weight control logic means. The weight control logic means preferably comprises a plurality of stages each of which includes an AND gate and and Exclusive-OR gate (XOR gate). These gates are arranged in alternating order with an AND gate and Exclusive-OR gate in each stage and with each stage supplying a signal to a subsequent stage. The circuit is similar to conventional cascaded AND gates for generating weighted random pattern sequences. However, interposed between each AND gate is an Exclusive-OR gate which is controlled by a weight control signal. Through selection of the weight control signals supplied to the Exclusive OR gates it thus becomes possible to generate all possible weights of the form $i/2^N$ for all values of i ranging from 0 through $2^N$. The resulting universal weight generator has a cascade structure and is readily expandable by the addition of any number of cascaded stages. The resulting circuit is useful in any weighted random pattern architecture that requires a serial input of weighted pseudo-random bits.

Accordingly, it is an object of the present invention to provide a mechanism for weighted random test pattern generation.

It is also an object of the present invention to provide a mechanism in which weighting factors are universally controllable and are not limited to a small set of integer multiples of $2^{-N}$.

It is yet another object of the present invention to improve test fault coverage in integrated circuit devices.

It is a still further object of the present invention to provide universal weight factor generation mechanisms requiring a minimal number of additional circuit components, but yet which is flexible and is easily implementable in terms of known weighted random pattern circuits and methods.

Lastly, but not limited hereto, it is an object of the present invention to increase the range of applicability of integrated circuit testing based upon weighted random pattern methods.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
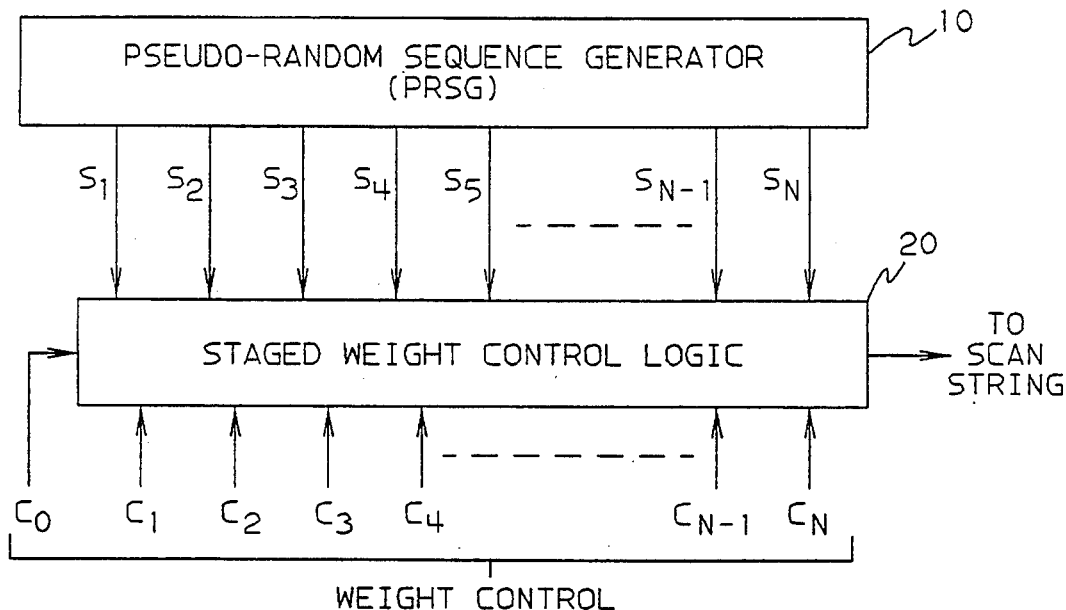
FIG. 1 illustrates, in block diagram form, the overall structure of the present invention.

One of the very desirable ways of testing integrated circuit chip devices and systems is through the insertion of a weighted random pattern test signal at various primary input points. The invention shown in FIG. 1 provides a structure for generating such a test signal. In particular, in FIG. 1 there is shown pseudo-random sequence generator (PRSG) 10. This generator preferably comprises a linear feedback shift register. Such devices configured with feedback arrangements to implement multiplication of polynomial elements in a Galois field, are typically employed to produce sequences of states which are representative of random binary sequences. However, it is noted that pseudo-random sequence generator 10 might also comprise a cellular array or any other finite state machine whose state sequences provide a sufficient degree of pseudo-randomness. Typically, sequence generator 10 has a large plurality of stages. However, for purposes of the present invention, it is sufficient to employ only a plurality, say N, of these signal lines. The signal lines are preferably the output lines of widely spaced latches in an LFSR. These N pseudo-random binary sequences are supplied to staged weight control logic mechanism 20 which receives a plurality N+1, of weight control signals. These weight control signals which have not heretofore been present in weighted random pattern generation devices. Instead, such devices have employed multiplexors (MUX units) to select inputs from a small subset of possible outputs which exhibit different weight factors. Now these weight control lines provide the control mechanism for selecting the appropriate weight factor. The output from control mechanism 20 is preferably supplied to a scan string such as one employed in level sensitive scan design (LSSD) circuit methodology.

Figure 2:
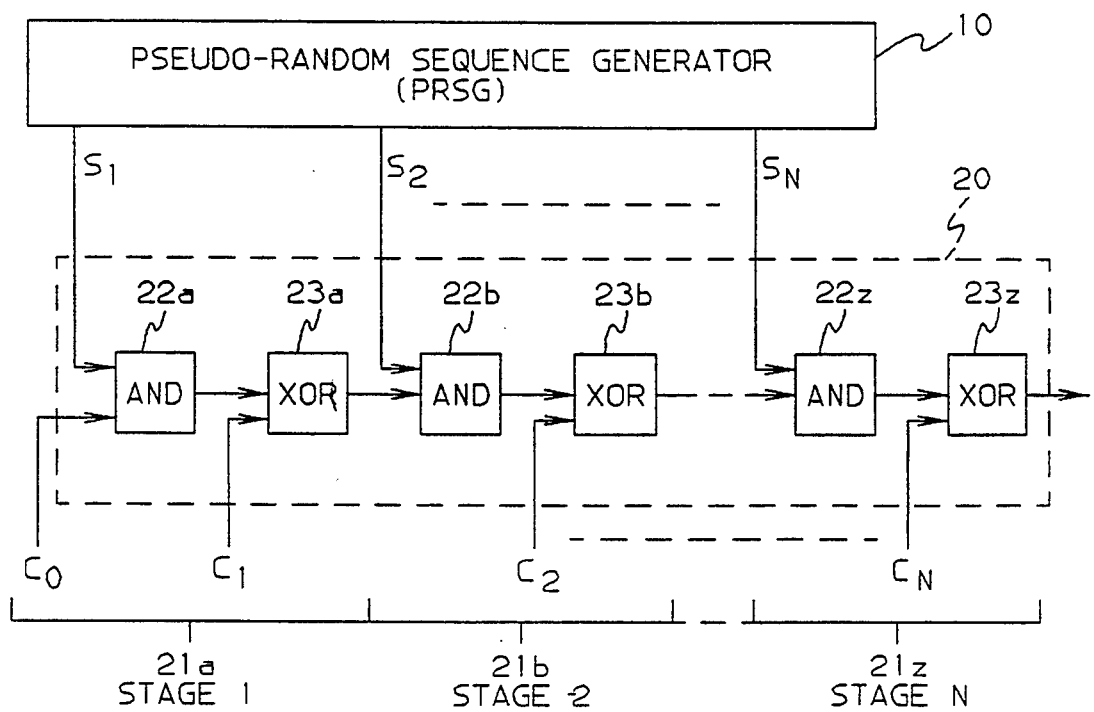
FIG. 2 illustrates in detail the staged structure of the staged weight control logic mechanism of the present invention particularly showing the AND and Exclusive-OR gates in each stage.

FIG. 2 provides a more detailed description of weight control logic mechanism 20. In particular, it is seen that weight control mechanism 20 comprises a plurality of cascaded stages 21a, 21b, ..., 21z labeled in FIG. 2 as stage 0, stage 1 and stage N. In general, N+1 is less than or equal to the number of PRSG signal lines employed. Preferably however, the number of steps, M, in the PRSG is made greater than N. Here there is an inherent design tradeoff between the desire to make M as large as possible to provide uncorrelated input signals and to desire to make M small to preserve chip circuit space. However, it should be kept in mind that if pseudo-random sequence generator 10 comprises a linear feedback shift register, it is preferable that N+1 is significantly less than the number of latches in the shift register.

Each stage includes conjunctive circuit means 22a, 22b or 22z whose output is supplied directly to an Exclusive-OR gate, (23a, 23b or 23z, respectively). Each AND gate receives a control signal, $c_0$ through $c_N$, which acts as a weight control factor. It is the values of zeroes and ones which are assigned to control lines $c_0$ through $c_N$ which determine the weighting factor to be applied to the pseudo-random binary sequence emanating from sequence generator 10.

If $c_0$, $c_1$, $c_2$, and $c_3$ are the control signals and W is the generated weight, then W is determined by the central signals as follows for the case where N=3:

| $c_0$ | $c_1$ | $c_2$ | $c_3$ | W |
|---|---|---|---|---|
| 0 | 0 | 0 | 0 | 0 |
| 0 | 0 | 0 | 1 | $\frac{1}{8}$ |
| 0 | 0 | 1 | — | $\frac{1}{4}$ |
| — | 1 | — | 0 | $\frac{1}{2}$ |
| — | 1 | — | 1 | $\frac{1}{2}$ |
| 1 | 0 | 0 | 0 | $\frac{5}{8}$ |
| 1 | 0 | 0 | 1 | $\frac{5}{8}$ |
| 1 | 0 | 1 | 0 | $\frac{3}{4}$ |
| 1 | 0 | 1 | 1 | $\frac{7}{8}$ |

The (-) is a "don't care" condition. Thus, there are two control patterns that generate a weight of $\frac{1}{2}$: 0010, and 0011. There are four control patterns that generate a weight of $\frac{1}{4}$: 0100, 0110, 1100, 1110. Similarly, there are four control patterns that generate a weight of $\frac{3}{4}$: 0101, 0111, 1101, and 1111.

The control signals applied to Exclusive-OR gates 23a, 23b through 23z act as conditional inverting signals. It is traditional to think of the Exclusive-OR gate as a normal OR gate in which the possibility of both inputs being true precludes a true output. That is, the Exclusive-OR gate is normally thought of as implementing the function "either or but not both". However, in the present context, the Exclusive-OR gates employed are better understood to operate as conditional inverting circuits. That is when any of the control signals $c_i$ is a 0, the output of the corresponding AND gate is allowed to pass through unaltered. However, if any of the control signals are turned on, the corresponding Exclusive-OR gate implements an inverting function. Thus, the Exclusive-OR gate can also be considered to be a conditional inverter, the inversion being conditioned upon the value of the control line signal. In this way the inversion of selected bits along the cascaded chain can be made to affect the probabilities at each and every stage.

Thus in each stage (except the first) there is an AND gate which receives an input from the previous stage and a pseudo-random binary signal $S_i$ from sequence generator 10. The output of the AND gate in each stage is supplied to an Exclusive-OR gate (conditional inverter) (in each stage) which is controlled by a weight control signal whose value is determined by the tester and/or test programs being run. However, in the first stage the AND gate receives and maybe set up to receive a control signal, $c_0$.

In the design provided above, there may be provided any number of stages, the number of stages only being limited by the number of latches in the LFSR implementation of the PRSG. Also, as indicated above, the number of control signals N+1 is preferably much less than or equal to the number of stages in PRSG 10.

While the circuit illustrated in FIG. 2 in each stage indicates that each stage includes an AND gate and an Exclusive-OR gate, it is also possible to combine these two gates into a combinatorial logic circuit which has only two levels rather than the implicitly three level circuit shown in FIG. 2. In particular, it is noted that the Exclusive-OR gate is typically implementable only in the format a two-level combinatorial circuit. Thus, with the inclusion of the AND gate, the overall logic circuit in each stage includes three levels. It is possible, if desired for purposes of speed and circuit count, to reduce the combinatorial logic to a two-level circuit. However, this two-level circuit requires true and complementary forms of all inputs to each stage. This is not a problem for signals from sequence generator 10 or from circuits which provide weight control signals $c_i$. However, the necessity of providing the negative or complement form for the input to the AND gate from the previous stage poses a requirement that the previous stage generate either the true or complemented output forms in alternating stages. However, at the expense of increasing the number of circuit components this is a possible objective in those circumstances where it is desirable to be able to generate the weighted random pattern as quickly as possible.

For example, if $Z_{i+1}$ is the output from the XOR gate of stage i and $Z_i$ is the input to the AND gate of stage i, then the relationship between these quantities is representable by the following Boolean equation which is manipulated below as shown to illustrate a two-level circuit embodiment having a 3-input OR gate fed by three AND gates, one of these AND gates having three inputs and the other two AND gates having only two inputs each:

$$\begin{aligned} Z_{i+1} &= S_i Z_i \oplus C_i \\ &= S_i Z_i C_i + \overline{S_i Z_i} \overline{C_i} \\ &= (S_i + Z_i) C_i + \overline{S_i} \overline{Z_i} \overline{C_i} \\ &= \overline{S_i} C_i + \overline{Z_i} C_i + \overline{S_i} \overline{Z_i} \overline{C_i} \end{aligned}$$

One of the significant advantages of the circuit of the present invention is that its design readily permits extension to any degree of granularity (as measured by $2^N$) desired, simply by increasing the number of cascaded stages.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A circuit for generating a controllably weighted binary sequence, said circuit comprising:

means for generating a first plurality, said first plurality being N, of pseudo-random binary signal sequences; and a second plurality, said second plurality also being N, of logic circuit stages, wherein each of said stages receives one of said binary sequences from said generating means, and wherein each of said stages also receives a specifiable weighting control signal, said stages being cascaded so that the output of each stage is supplied as input to its subsequent stage; and wherein each stage includes conjunctive circuit means having as input said preceding stage output and one of said pseudo-random binary signal sequences, with the output of said conjunctive circuit means being supplied to conditional inverter circuit means which also has an input said specifiable weighing control signal and whose output is supplied to the conjunctive circuit means in said subsequent stage.

* * * * *